United States Patent
Tani et al.

(10) Patent No.: US 6,869,665 B2
(45) Date of Patent: Mar. 22, 2005

(54) WIRING BOARD WITH CORE LAYER CONTAINING INORGANIC FILLER

(75) Inventors: Motoaki Tani, Kawasaki (JP);
Nobuyuki Hayashi, Kawasaki (JP);
Tomoyuki Abe, Kawasaki (JP);
Yasuhito Takahashi, Kawasaki (JP);
Yoshiyasu Saeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/644,004

(22) Filed: Aug. 20, 2003

(65) Prior Publication Data

US 2004/0151882 A1 Aug. 5, 2004

(30) Foreign Application Priority Data

Sep. 26, 2002 (JP) .......................... 2002-281011

(51) Int. Cl.⁷ ................................. B32B 3/00
(52) U.S. Cl. ................ 428/209; 428/901; 174/250; 174/255
(58) Field of Search ................ 428/209, 901; 174/255, 258

(56) References Cited

U.S. PATENT DOCUMENTS

| | | | | | |
|---|---|---|---|---|---|
| 4,221,925 A | * | 9/1980 | Finley et al. | ............... | 174/266 |
| 4,591,659 A | | 5/1986 | Leibowitz | | |
| 4,642,160 A | * | 2/1987 | Burgess | ............... | 216/18 |
| 4,689,110 A | | 8/1987 | Leibowitz | | |
| 4,812,792 A | | 3/1989 | Leibowitz | | |
| 5,451,721 A | * | 9/1995 | Tsukada et al. | ............... | 174/261 |
| 5,670,250 A | * | 9/1997 | Sanville et al. | ............... | 428/323 |
| 5,888,627 A | * | 3/1999 | Nakatani | ............... | 428/209 |
| 5,945,222 A | * | 8/1999 | Nagase et al. | ............... | 428/416 |
| 6,013,588 A | | 1/2000 | Ozaki | | |
| 6,114,005 A | * | 9/2000 | Nagai et al. | ............... | 428/114 |
| 6,124,023 A | * | 9/2000 | Furuta et al. | ............... | 428/172 |
| 6,224,965 B1 | * | 5/2001 | Haas et al. | ............... | 428/209 |
| 6,373,000 B2 | * | 4/2002 | Nakamura et al. | ............... | 174/264 |
| 6,428,942 B1 | * | 8/2002 | Jiang et al. | ............... | 430/312 |
| 6,518,515 B2 | * | 2/2003 | Nishii et al. | ............... | 174/262 |
| 6,586,526 B1 | * | 7/2003 | Sekimoto et al. | ............... | 525/113 |

FOREIGN PATENT DOCUMENTS

| | | |
|---|---|---|
| JP | 60-140898 | 7/1985 |
| JP | 11-040902 | 2/1999 |
| JP | 11-112145 | 4/1999 |
| JP | 2000-138453 | 5/2000 |
| JP | 2001-332828 | 11/2001 |

* cited by examiner

Primary Examiner—Cathy F. Lam
(74) Attorney, Agent, or Firm—Staas & Halsey LLP (57) ABSTRACT

A wiring board includes a core layer and a pair of multilayer wiring portions. The core layer, having an upper surface and a lower surface, is formed from a resin composite which contains resin filler and encloses several pieces of carbon fiber cloth. One of the multilayer wiring portions is stacked on the upper surface of the core layer, while the other is stacked on the lower surface of the core layer. Each multilayer wiring portion is composed of a number of insulating layers and wiring patterns stacked alternately with the insulating layers. The wiring patterns of the upper and the lower wiring portions are connected to each other by conductors extending through the entire thickness of the core layer.

12 Claims, 5 Drawing Sheets

WIRING BOARD WITH CORE LAYER CONTAINING INORGANIC FILLER

BACKGROUND OF THE INVENTION

1. Field of the Invention

The present invention relates to a wiring board suitable for providing semiconductor chip mounting boards, motherboards, substrates for probe cards, and so on.

2. Description of the Related Art

Recent electronic products have been improved to meet the requirement for higher performance and further size reduction. Accordingly, high density mounting techniques are developed for electronic parts to be incorporated in those small electronic products. To attain such high density mounting, semiconductor chips are often designed as bare chips that are surface-mountable on the wiring board (flip-chip mounting). For mounting semiconductor chips with high density, use is often made of multilayer wiring boards, which are suitable for multi-pin type chips.

These semiconductor chips, mounted on a multilayer wiring board, are often packaged to provide a semiconductor unit. Such a unit or package may be mounted on a motherboard, serving as an integral part of the desired electronic circuit. The motherboard used for such purposes may also have a multilayer wiring structure for achieving high density wiring. A multilayer wiring structure is also employed for making probe cards used for measurement or inspection of electronic products such as individual semiconductor chips or semiconductor wafers with a number of semiconductor elements built in.

In the flip-chip mounting, an under filler is generally used to fill a gap between the wiring board and the semiconductor chips mounted thereon. If the under filler is not used, electrical connection between the wiring board and the semiconductor chips is often not reliable enough because of the difference in thermal expansion coefficient between the wiring board and the semiconductor chips. Typically, a semiconductor chip made of a common material has a thermal expansion coefficient of about 3.5 ppm/° C. as viewed in the surface-spreading direction (which is perpendicular to the normal of the principal plane of the chip). On the other hand, a typical wiring board including a core substrate provided by a glass epoxy substrate has a thermal expansion coefficient of about 12~20 ppm/° C. in the surface-spreading direction. Thus, the difference in the thermal expansion coefficient between the two is relatively large. Due to this, any change in surrounding temperature can produce stress in the connecting portions between the wiring board and the semiconductor chips. When the stress at the electrical connection exceeds a limit, the boundary surface between bumps of the semiconductor chip and the electrode pads of the wiring board can easily crack or be separated from each other. The under filler applied between the semiconductor chip and the wiring board serves to mitigate the stress at the connecting portions.

However, when a large semiconductor chip is mounted on a wiring board, the stress reduction by the under filler alone is often insufficient to ensure desirable reliability. This is because the difference in thermal expansion between the semiconductor chip and the wiring board increases as the chip becomes larger, whereby an unduly great stress can be produced at the connecting portions between the chip and the wiring board. The same problem can occur in a case where a large semiconductor wafer or chip is mounted on a probe card.

The above problem resulting from the difference in the thermal expansion coefficient can be eliminated or reduced by using a wiring board of a small thermal expansion coefficient. Such a wiring board may include a core substrate made of a metal having a small thermal expansion coefficient. Examples of the metal for a core substrate may be aluminum, copper, silicon steel, nickel-iron alloy, or CIC (a clad having copper/Invar/copper layers). Japanese patent application laid-open No. 11(1999)-112145 and No. 2000-138453 disclose a wiring board provided with a metal core substrate. However, since a metal material has a considerably great specific gravity, the resultant wiring board is disadvantageously heavy. In addition, it is rather difficult to perform fine processing (boring, thin plate working, etc.) with respect to a metal core substrate.

It is conventionally known that the thermal expansion of a wiring board can also be reduced by using a carbon fiber material. Typically the thermal expansion coefficient of a carbon fiber is about −5~3 ppm/° C. In this connection, Japanese patent application laid-open No. 60(1985)-140898 discloses a wiring board having a multilayer structure in which insulating layers (containing carbon fiber sheets) and copper wiring layers are alternately stacked. Japanese patent application laid-open No. 11(1999)-40902 discloses a multilayer wiring board including a core substrate which contains a carbon fiber sheet. On each side of the core substrate, an insulating layer (prepreg containing glass fiber) and a copper wiring layer are stacked. Japanese patent application laid-open No. 2001-332828 discloses a multilayer wiring board including a core substrate which contains a carbon fiber sheet. On each side of the core substrate, an insulating layer (a prepreg containing no glass fiber) and a copper wiring layer are stacked. Since carbon fiber undergoes small thermal expansion, the insulating layer and the core substrate have a small expansion coefficient. Accordingly, the wiring board, including such an insulating layer and a core substrate, can have a small expansion coefficient in the surface-spreading direction.

While having the above advantage, the conventional wiring boards may suffer the following drawbacks.

In the conventional wiring board, as noted above, the incorporated carbon fiber sheet prevents the core substrate (or the insulating layer) from expanding in the surface-spreading direction. However, as viewed in the thickness direction (perpendicular to the surface-spreading direction), the thermal expansion coefficient of the core substrate is rendered greater than when no carbon fiber sheet is contained. When the expansion coefficient of the core substrate in the surface-spreading direction is below 10 ppm/° C., for instance, the core substrate will expand greatly in the thickness direction of the wiring board.

The reason why such a phenomenon can happen is as follows. In general, a resin material has a relatively great thermal expansion coefficient. According to the prior art arrangement of the core substrate, however, the resin expansion in the surface-spreading direction is strictly restricted by the integrated carbon fiber sheet. As a reaction of this, the resin material tends to expand greatly in the thickness direction of the board, in which the carbon fiber sheet can exert no restriction. Unfavorably, such expansion can break a through-hole via which may extend in the thickness direction of the wiring board through the core substrate.

SUMMARY OF THE INVENTION

The present invention has been proposed under the circumstances described above. It is, therefore, an object of the present invention to provide a wiring board whose thermal expansion coefficients are appropriately small in the thickness direction of the wiring board as well as in the surface-spreading direction thereof.

According to the present invention, there is provided a wiring board comprising: a core layer made of a carbon fiber material and a resin composite containing inorganic filler, the core layer including a first surface and a second surface opposite to the first surface; a first wiring portion provided with an insulating layer formed on the first surface of the core layer and with a wiring pattern formed on the insulating layer; and a conductor extending in the core layer in a normal direction of said surfaces of the core layer, the conductor being electrically connected to the wiring pattern.

Preferably, the conductor may extend throughout the core layer.

Preferably, the wiring board of the present invention may further comprise a second wiring portion provided with an insulating layer formed on the second surface of the core layer and with a wiring pattern formed on this insulating layer. The conductor is electrically connected to both the wiring pattern of the first wiring portion and the wiring pattern of the second wiring portion.

With the above arrangement, the core layer is sandwiched between the first and the second wiring portions in a symmetrical manner. Thus, it is possible to prevent the wiring board from being warped.

Preferably, the wiring board of the present invention may further comprise an insulating film for insulating the conductor from the core layer, the insulating film enclosing the conductor in the core layer.

Preferably, the first wiring portion may comprise a plurality of insulating layers and a plurality of wiring patterns stacked alternately with the insulating layers. At least one of the insulating layers may be formed with a via for electrically connecting adjacent wiring patterns.

Preferably, the core layer may have a first thermal expansion coefficient in said normal direction, the first thermal expansion coefficient being in a range of 20~120 ppm/° C. at 25° C.

Preferably, the core layer may have a second thermal expansion coefficient in a surface-spreading direction transverse to said normal direction, the second thermal expansion coefficient being in a range of 0~17 ppm/° C. at 25° C.

Preferably, the carbon fiber material may be in a form of mesh, cloth or nonwoven fabric. The carbon fiber material may have a thermal expansion coefficient in a range of –5~3 ppm/° C. (at 25° C.).

Preferably, the core layer may contain 30~80 vol % of carbon fiber material.

Preferably, the inorganic filler may have a thermal expansion coefficient in a range of 1~20 ppm/° C. at 25° C.

Preferably, the inorganic filler may be made of one of silica, alumina, magnesium hydroxide, aluminum nitride and aluminum hydroxide. The resin composite may contain 5~50 wt % of such inorganic filler. The inorganic filler may comprise inorganic particles having an average particle size not greater than 10 $\mu$m.

Preferably, the resin composite may comprise one of polysulfone, polyethersulfone, polyphenylsulfone, polyphthalamide, polyamide imide, polyketone, polyacetal, polyimide, polycarbonate, denatured polyphenylene ether, polyphenylene oxide, polybutyrene terephthalate, polyacrylate, polyphenylene sulfide, polyether ether ketone, tetrafluoroethylene, epoxy, cyanate ester, and bismaleimide.

The Other features and advantages of the present invention will become apparent from the detailed description given below with reference to the accompanying drawings.

DETAILED DESCRIPTION OF THE PREFERRED EMBODIMENTS

Figure 1:
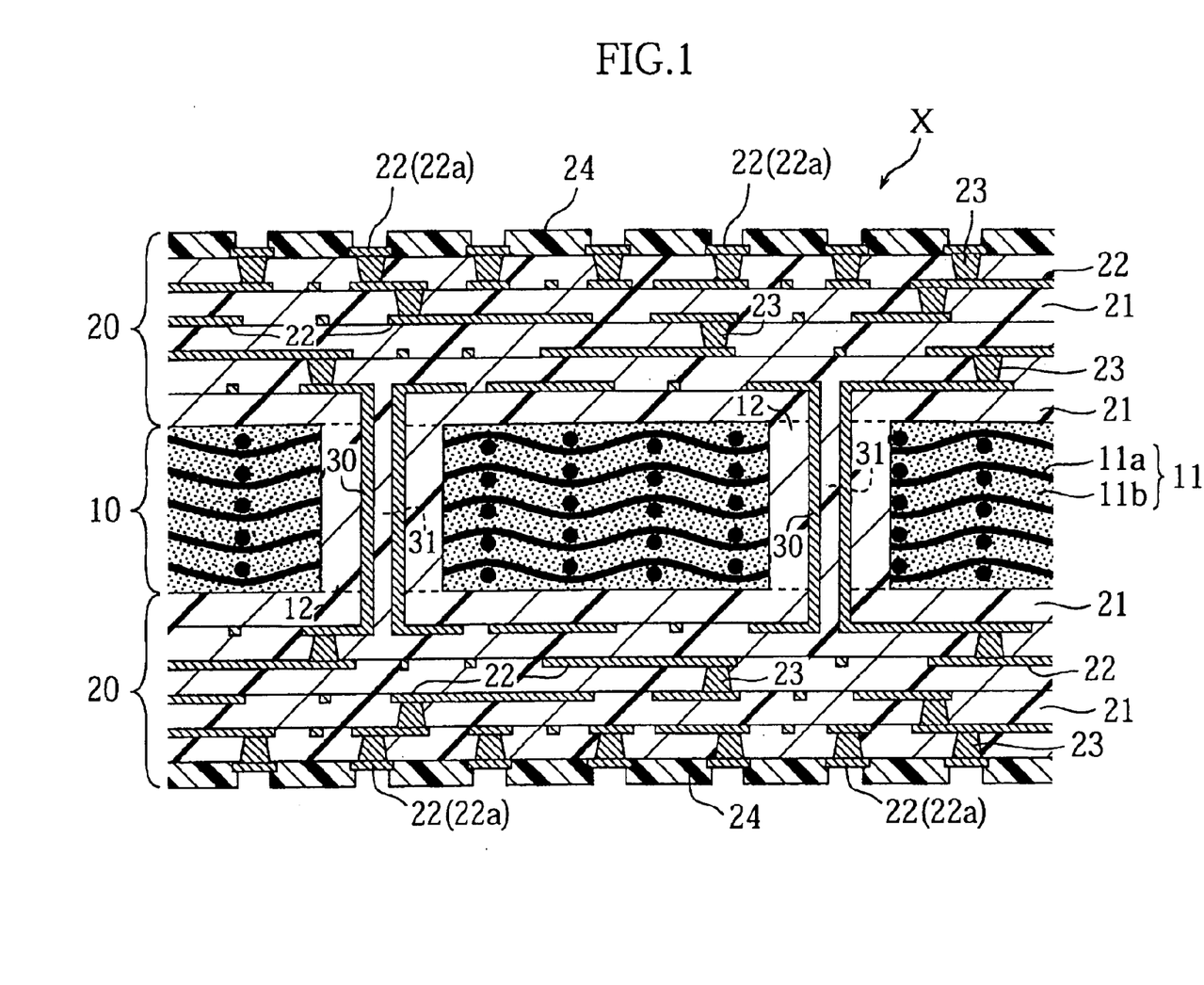
FIG. 1 is a sectional view showing the principal part of a multilayer wiring board according to the present invention.

Reference is first made to FIG. 1 showing the principal part of a multilayer wiring board X according to the present invention. As illustrated, the wiring board X comprises a core layer 10, a pair of build-up wiring portions 20, and vertically elongated conductors or through-hole vias 30.

The core layer 10 may be formed by processing a material plate made of carbon fiber reinforced plastic (CFRP). As seen from FIG. 1, the core layer 10 includes CFRP portions 11 and insulating resin portions 12. Though exaggerated in FIG. 1 for clarity of illustration, the actual volume of the insulating resin portion 12 is negligibly small as compared to that of the CFRP portion 11. The CFRP portion 11 is composed of a plurality of carbon fiber materials 11a and a hardened resin composite 11b enclosing the carbon fiber materials 11a.

In the preferred embodiment illustrated in FIG. 1, each carbon fiber material 11a is a cloth of carbon fiber threads that is spread horizontally (in the "surface-spreading direction") in the core layer 10. Five pieces of carbon fiber cloth are stacked in the thickness direction (that is, the normal direction of the upper or lower surface of the layer 10) in the illustrated example, though the present invention is not limited to this. The carbon fiber cloth may be replaced by carbon fiber mesh or carbon fiber nonwoven fabric. In the preferred embodiment, the core layer 10 (hence the CFRP portion 11, in light of the negligible volume of the insulating resin portions 12) contains 30~80 vol % of carbon fiber materials 11a. By varying the percentage of the contained materials 11a, it is possible to adjust the thermal expansion coefficient of the core layer 10 (hence the CFRP portion 11). If the ratio is below 30 vol %, the thermal expansion of the core layer 10 in the surface-spreading direction may be unacceptably large. If the ratio is above 80 vol %, on the other hand, the carbon fiber materials 11a may readily be detached from the resin composite 11b.

The resin composite 11b may be composed of a resin material and inorganic filler dispersed in the resin material. Examples of the resin material are polysulfone, polyethersulfone, polyphenylsulfone, polyphthalamide, polyamide imide, polyketone, polyacetal, polyimide, polycarbonate, denatured polyphenylene ether, polyphenylene oxide, polybutyrene terephthalate, polyacrylate, polyphenylene sulfide, polyether ether ketone, tetrafluoroethylene, epoxy, cyanate ester, and bismaleimide.

Examples of the inorganic filler are fine particles of silica (i.e. silica powder), alumina powder, magnesium hydroxide powder, aluminum nitride powder, and aluminum hydroxide powder. In the preferred embodiment, the weight average particle size of the inorganic filler is no greater than 10 $\mu$m, and the ratio of the filler contained in the resin composite 11b is 5~50 wt %. If the ratio is below 5 wt %, the thermal expansion coefficient of the core layer 10 in the thickness or normal direction may fail to be sufficiently small. If the ratio is above 50 wt %, on the other hand, the core layer 10 may fail to be drilled properly, for example. Preferably, the thermal expansion coefficient of the inorganic filler may be 1~20 ppm/° C. (at 25° C.).

In the preferred embodiment, the non-processed core layer 10 (and the CFRP portion 11) has a thermal expansion coefficient of 0~17 ppm/° C. (at 25° C.) in the surface-spreading direction. When the multilayer wiring board X of the present invention is to be used as a chip-mounting substrate for an LGA(Land Grid Array) package or as a motherboard, the thermal expansion coefficient of the core layer 10 may preferably be 0~6 ppm/° C. (at 25° C.). Similarly, when the multilayer wiring board X of the present invention is to be used as a chip-mounting substrate for a BGA(Ball Grid Array) package, the thermal expansion coefficient of the core layer 10 may preferably be 3~17 ppm/° C. (at 25° C.).

Each of the insulating resin portions 12 is provided for insulating the relevant through-hole via 30 from the carbon fiber materials 11a of the CFRP portion 11. The resin portion 12 may be formed from one of the resins mentioned above with respect to the resin composite 11b.

The upper and the lower build-up portions 20 are produced by the build-up method to provide a multilayer wiring layout. Each of the build-up portions 20 is composed of several insulating layers 21 and wiring patterns 22 stacked in the thickness direction of the wiring board X. The insulating layer 21 may be formed from one of the resins mentioned above with respect to the resin composite 11b. The wiring pattern 22, which may be made of copper, has a prescribed pattern provided on a relevant insulating layer 21. Any one of the wiring patterns 22 is connected to the adjacent upper or lower (or both) wiring pattern 22 by a via 23. As seen from FIG. 1, the uppermost wiring pattern 22 is provided with several electrode pads 22a for external connection. The upper surface of the upper build-up portion 20 and the lower surface of the lower build-up portion 20 are covered by an overcoat layer 24 formed with openings for exposing the electrode pads 22a.

The through-hole vias 30 are provided for connecting the wiring in the upper build-up portion 20 to the wiring in the lower build-up portion 20, and vice versa. The through-hole via 30 may be produced by plating the inner wall surface of the through-hole 31 formed to extend through the core layer 10.

Figure 2A:
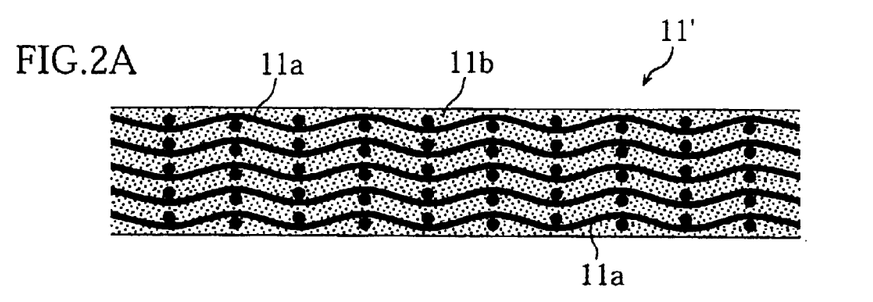
FIGS. 2A~2J illustrate a fabrication process of the wiring board shown in FIG. 1.

FIGS. 2A~2J show a fabrication method of the multilayer wiring board X. First, as shown in FIG. 2A, a CFRP plate 11' is prepared. The CFRP plate 11' is composed of five carbon fiber materials 11a and a hardened resin composite 11b enclosing the carbon fiber materials 11a. As noted above, the resin composite 11b contains inorganic filler.

The CFRP plate 11' may be produced in the following manner. First, a carbon fiber material 11a is impregnated with a resin composite 11b in liquid form. Then, a carbon fiber-reinforced (CFR) prepreg is obtained by drying the impregnated resin composite 11b of the carbon fiber material 11a with attention paid not to allow the composite 11b to harden. In the same manner, four more CFR prepregs are made. The thus obtained five prepregs are stacked to provide a prepreg laminate. Finally, under a heating condition, the prepreg laminate is squeezed in the thickness direction (laminating direction of the five prepregs), so that the five prepregs are integrated into the desired CFRP plate 11'.

Figure 2B:
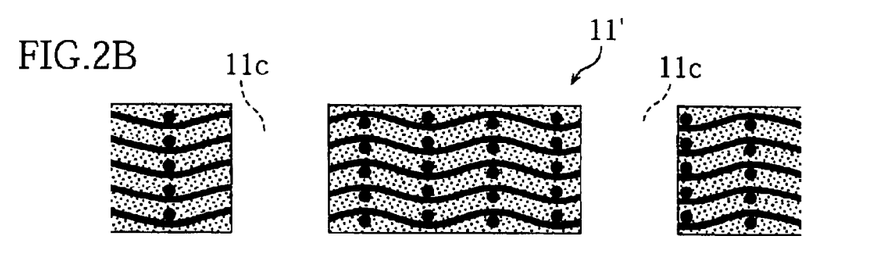

The CFRP plate 11', as shown in FIG. 2B, is formed with through-holes 11c at prescribed locations. Each of the through-holes 11c is greater in diameter by 0.2~1.0 mm for example, than the above-noted through-hole via 30. The through-hole 11c may be made by drilling, punching, or laser ablation, for example.

Figure 2C:
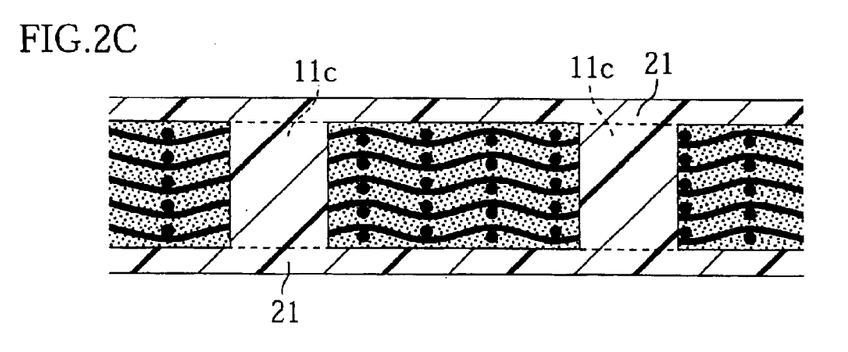

Then, referring to FIG. 2C, a thermosetting resin material is applied to both the upper and the lower surfaces of the CFRP plate 11', and heated to provide solid upper and lower resin layers 21. Simultaneously, the through-holes 11c are filled up by the applied resin. The resin layers 21 correspond to the innermost insulting layers of the build-up portions 20 (FIG. 1). The applied resin material may be one of the resins mentioned above with respect to the resin composite 11b.

Figure 2D:
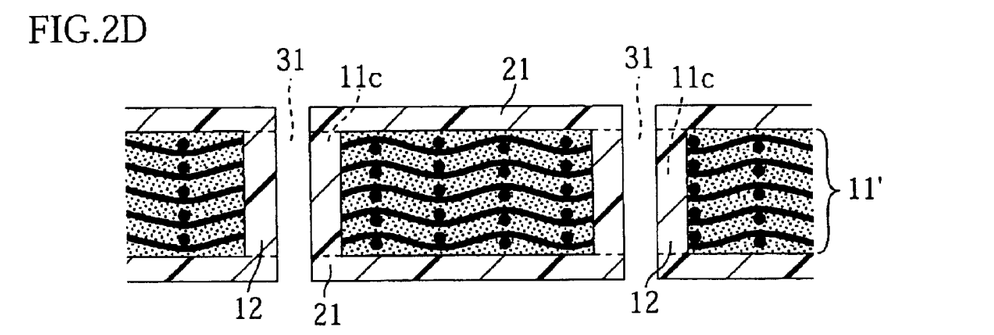

Then, as shown in FIG. 2D, through-holes 31 are formed at positions corresponding to the through-holes 11c in the CFRP plate 11'. The axis of any through-hole 31 coincides with that of the corresponding through-hole 11c. The diameter of the through-hole 31 is made smaller than that of the through-hole 11c. The formation of the through-holes 31 may be performed by a dry etching process utilizing UV-YAG laser, carbon dioxide laser, excimer laser, or plasma for example. Since the diameter of the through-hole 31 is smaller than that of the through-hole 11c, an cylindrical insulating resin portion 12 is formed on the wall surface of the through-hole 11c.

Figure 2E:
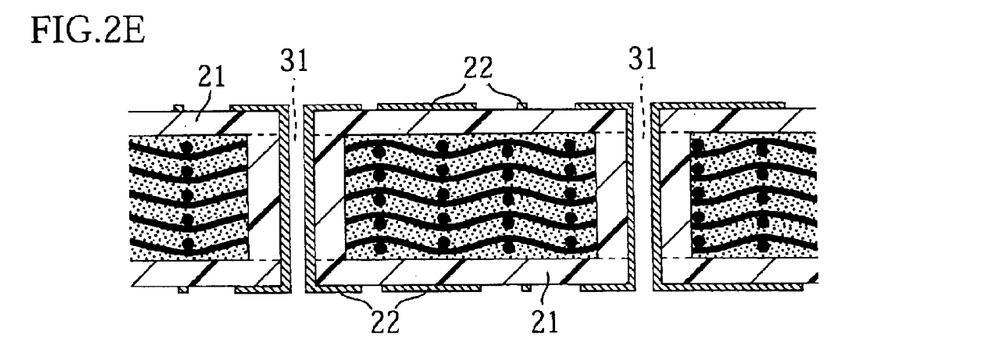

Then, as shown in FIG. 2E, wiring patterns 22 are formed on the upper and the lower insulating layers 21 by the semi-additive process. At this stage, the through-hole vias 30 are also formed on the wall surface of the respective through-holes 31. Specifically, the surfaces of the insulating layers 21 and through-holes 31 may be subjected to a desmear process, as required. Thereafter, those desmeared surfaces are plated with copper by electroless plating. Then, a resist pattern is formed on the copper plating layer ("seed layer" below) by a known method. The resist pattern has non-masking portions corresponding to the desired wiring pattern 22. The through-holes 31 are exposed at the non-masking portions. Then, electroplating is performed so that copper is deposited on the seed layer through the non-masking portions of the resist pattern. At this time, a through-hole via 30 is formed at the through-hole 31. Then, the resist pattern is removed by etching, for example, and further the exposed portions of the copper seed layer are etched away. Thus, the desired wiring pattern 22 results.

Figure 2F:
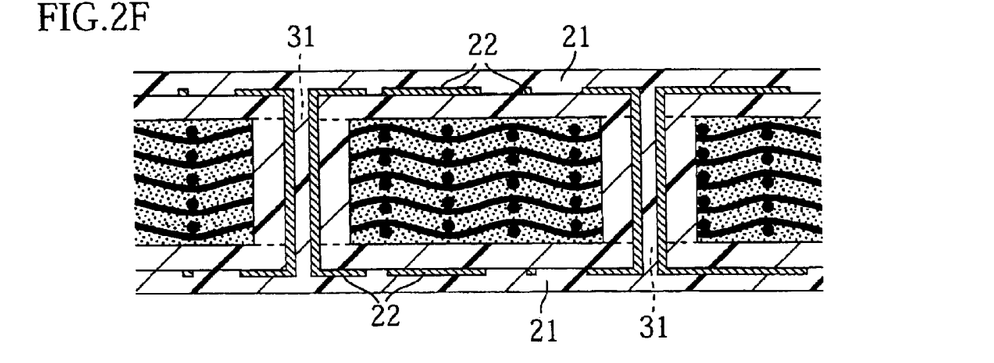

Then, as shown in FIG. 2F, the upper and the lower wiring patterns 22 are enclosed by additional or second insulating layers 21 formed on the previous ones (i.e. the innermost insulating layers 21 shown in FIG. 2E). At this time, the pressure in the through-hole 31 may be reduced. As a result of this, the fluid resin material applied for forming the second insulating layers 21 is drawn into the through-hole 31, thereby filling up the through-hole 31.

Figure 2G:
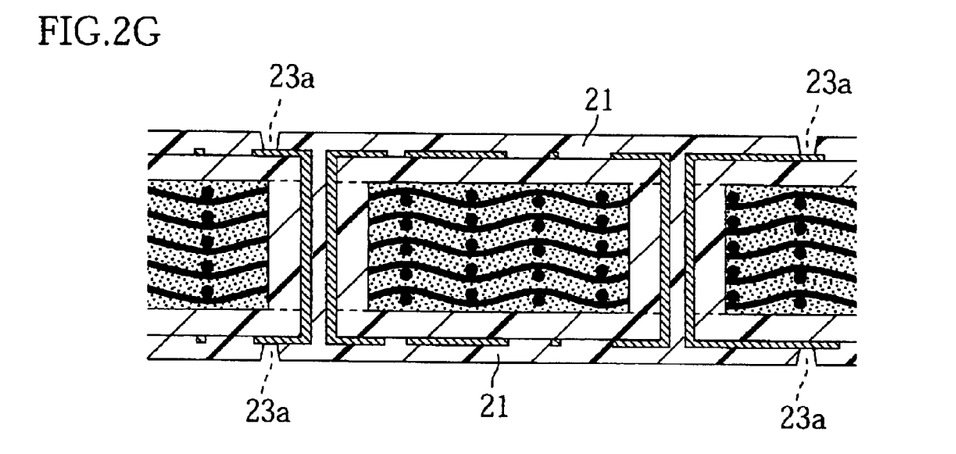

Then, as shown in FIG. 2G, via holes 23a are formed in the second insulating layers 21 on the upper and the lower sides. The formation of the via holes 23a may be performed by dry etching, for example, that utilizes UV-YAG laser, carbon dioxide laser, excimer laser, or plasma. Alternatively, the via holes 23a may be produced by photolithography, when the second insulating layers 21 are made of a photo-sensitive resin.

Figure 2H:
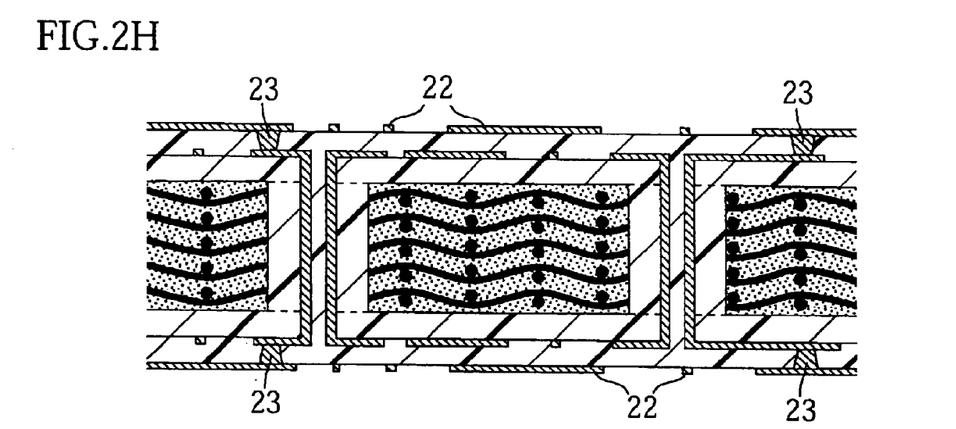

Then, as shown in FIG. 2H, the semi-additive process is performed to make second wiring patterns 22 upon the second upper and lower insulating layers 21, while also forming vias 23 at the respective via holes 23a. Specifically, the second insulating layers 21 and the via holes 23a may be desmeared, as required, for forming copper layers (copper seed layers) thereon by electroless plating. Then, a resist pattern is formed on each of the copper seed layers with the use of a photo resist. The resist pattern has non-masking portions from which the via holes 23a are exposed. Then, electroplating is employed to deposit copper on the copper seed layers through the non-masking portions of the resist pattern. Finally, the resist pattern is removed, and the exposed portions of the copper seed layers are etched away. Thus, the desired wiring patterns 22 and the vias 23 are obtained.

Figure 2I:
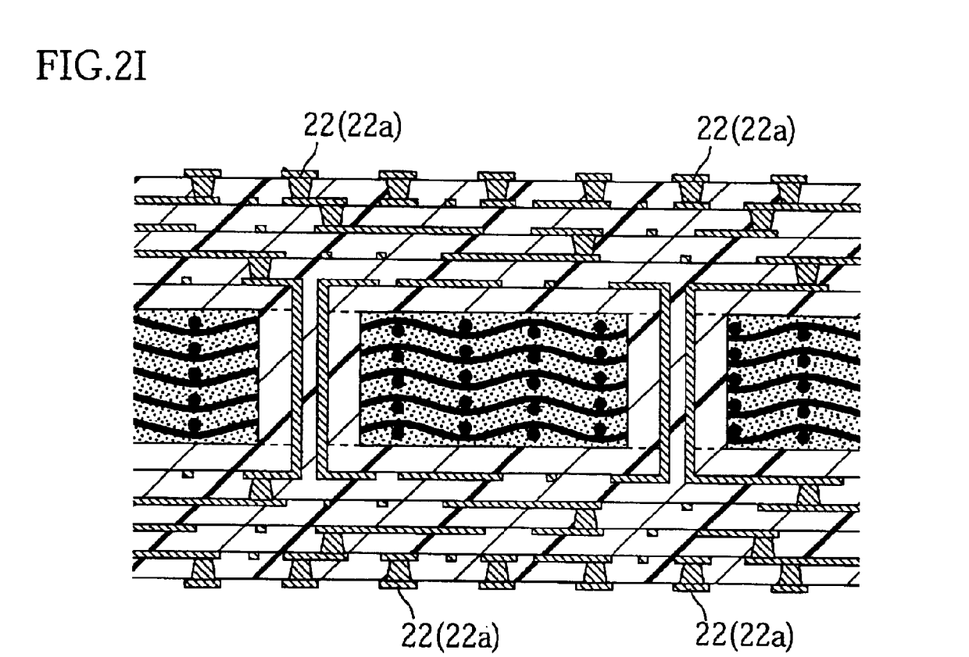

To produce the multilayer wiring board X of the present invention, the above-described processes (i.e. forming processes of insulating layers 21, wiring patterns 22 and vias 23) are repeated a prescribed number of times, so that the multilayer wiring layers (build-up portions) as shown in FIG. 2I are formed on the upper and the lower sides of the core layer 10. In the illustrated embodiment, five-storied wiring patterns 22 are provided on the respective sides of the core layer 10. The outermost wiring pattern 22 on each side is provided with electrode pads 22a for external connection. Though not shown in FIG. 2I, an additional metal layer is formed on each electrode pad 22a. This metal layer may be formed by plating or printing of gold (Au), for example, and connected to the pad 22a by an intervening conductive material such as solder, Pd, Ag, Ag—Sn alloy and Ni.

Figure 2J:
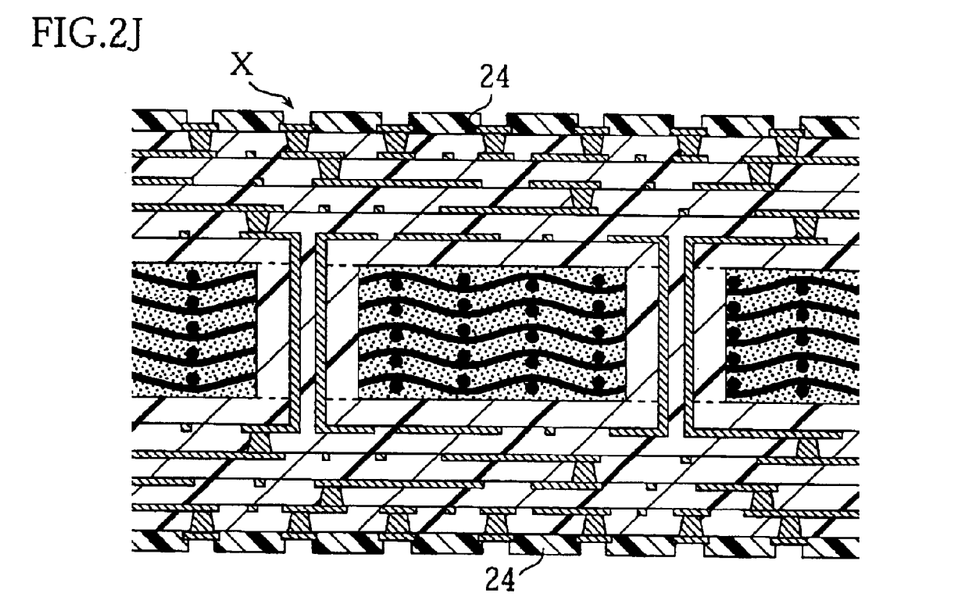

Then, as shown in FIG. 2J, the upper and the lower surfaces of the respective build-up wiring structures are covered by an overcoat layer 24. As seen from the figure, the overcoat layer 24 is formed with openings for exposing the electrode pads 22a. The formation of the overcoat layer 24 may proceed as follows. First, a suitable resin material is applied over the multilayer wiring structure by a printing technique, for example. Preferably, the resin to be applied may be highly insulating and heat-resistive material such as epoxy, polyimide, acrylic, and BT (bismaleimide triazine). Then, openings are formed at the prescribed locations by photolithography, for example.

Through the above-described procedure, a multilayer wiring board X is obtained, which includes a core layer 10, upper and lower build-up portions 20 stacked on the core layer 10, and through-hole vias 30 penetrating the core layer 10.

The core layer 10 has a small thermal expansion coefficient in the surface-spreading direction, due to the carbon fiber materials 11a extending in this direction. Comprising the core layer 10, the multilayer wiring board X has a thermal expansion coefficient (as viewed in the surface-spreading direction) which significantly depends on the coefficient of the core layer 10. Therefore, it is possible to increase or decrease the thermal expansion coefficient of the wiring board X in the surface-spreading direction by adjusting the amount of the carbon fiber materials 11a contained in the core layer 10. For instance, a small expansion coefficient ranging 0~17 ppm/° C. (at 25° C.) can be attained for the board X by controlling the content of the carbon fiber materials 11a. Further, the wiring board X can have a thermal expansion coefficient which is equal or substantially equal to that of a semiconductor chip to be mounted on the board X.

According to the present invention, the resin composite 11b of the core layer 10 contains inorganic filler. Due to this arrangement, the thermal expansion coefficient of the resin composite 11b can be made appropriately small in every direction, including the surface-spreading direction and the thickness direction of the core layer 10. In the surface-spreading direction, the thermal expansion coefficient of the resin composite 11b is made equal or substantially equal to that of the carbon fiber materials 11a. In the conventional wiring board, the resin composite of the core layer tends to expand to a greater extent than the carbon fiber cloth contained in the core layer. The expansion, however, can be directed in the thickness direction of the core layer because the restriction of the carbon fiber cloth does not work in the direction. According to the present invention, this problem can be overcome by adding inorganic filler to the resin composite 11b, so that the thermal expansion coefficient of the resin composite 11b becomes as small as that of the carbon fiber materials 11a. With this arrangement, the thermal expansion of the resin composite 11b in the thickness direction is made small. In addition, the horizontal expansion (i.e. in the surface-spreading direction) of the composite 11b is prevented from being directed in the thickness direction, since the composite 11b and the carbon fiber materials 11a expand equally in the surface-spreading direction. Therefore, no breakage occurs at the through-hole vias 30 extending in the thickness direction of the core layer 10.

Further, the multilayer wiring board X of the present invention has a fine and high-density wiring structure on the build-up portions 20 produced by the build-up method. Thus, the electrode pads 22a for external connection can be disposed at small pitches on the outermost wiring pattern 22. This is advantageous for connection or mounting of a semiconductor chip having a number of connection pins arranged at small pitches.

The present invention will now be described with reference to Examples 1–2 and Comparative Samples 1–2 below.

EXAMPLE 1
<Making the Multilayer Wiring Board>

In this example, the CFRP plate was formed from carbon fiber cloth and a polyimide resin composite. The CFRP plate was produced in the following manner. First, carbon fiber cloth (Brand name: TORAYCA manufactured by Toray Industries Inc.) was impregnated with a thermosetting polyimide resin composite and then dried to provide a prepreg having a thickness of 0.2 mm. The carbon fiber cloth was a flat-woven material formed from carbon fiber threads each made by bundling 200 or more carbon fibers (each fiber has a diameter not greater than 10 $\mu$m). Before hardened, the polyimide resin composite contained monomers (for forming the polymer), a hardener, and inorganic fillers such as alumina powder (no greater than 7 $\mu$m in weight average particle size) and silica powder (no greater than 3 $\mu$m in weight average particle size). The polyimide resin composite contained a 10 wt % of alumina powder and a 10 wt % of silica powder. The thermal expansion coefficient of the alumina powder was 7 ppm/° C. (at 25° C.), while the thermal expansion coefficient of the silica powder was 3 ppm/° C. (at 25° C.).

To form the CFRP plate, five prepregs were prepared in the above-described manner. Then, these prepregs were stacked and pressed together (i.e. squeezed in the stacking direction) in a vacuum at 200° C. for one hour. As a result, a CFRP plate (1 mm in thickness) was obtained. The average thermal expansion coefficients of the CFRP plate (at 25~200° C.) were 2 ppm/° C. in the surface-spreading direction and 80 ppm/° C. in the thickness direction.

The CFRP plate was formed with a prescribed number of through-holes (each having a diameter of 0.5 mm) by drilling. Then, the CFRP plate was subjected to degreasing and also to cleaning. Thereafter, the upper and the lower surfaces of the CFRP plate were laminated by an insulating layer formed from a thermoplastic polyimide sheet (Brand name: Espanex manufactured by Nippon Steel Chemical Co., Ltd.). The lamination of the polyimide sheet was performed by vacuum pressing at 200° C. for 30 minutes, so that the resultant insulating layer had a thickness of 0.05 mm. The through-holes formed in the CFRP plate were filled up by the polyimide resin.

Then, at each through-hole filled up by the resin, a diametrically smaller through-hole is formed with the use of UV-YAG laser. The smaller through-hole had a diameter of 0.2 mm and was coaxial with the larger through-hole formed in the CFRP plate. Then, the semi-additive process was performed to make a copper wiring pattern on each of the upper and lower insulating layers and to make a through-hole via at each of the smaller through-holes formed in the polyimide resin. Specifically, after necessary desmearing was performed, electroless plating was performed to form copper layers ("seed copper layers") on the insulating layers and on the wall surfaces of the respective through-holes (that is, the smaller through-holes formed in the polyimide resin). Then, a photo resist was formed on the copper layer to make a resist pattern by a known method. The resist pattern has non-masking portions corresponding to the wiring pattern to be desired. Then, electroplating was performed to deposit copper on the copper seed layers through the non-masking portions. Then, after the resist pattern was removed by etching, the exposed portions of the seed copper layers were etched away. The etchant was a mixture of hydrogen peroxide solution and sulfuric acid. With the above a semi-additive process, the upper and the lower wiring patterns on the innermost layers were connected to each other by through-hole vias extending vertically through the core layer.

Then, another build-up insulating layer was formed over each of the innermost wiring patterns. Specifically, for forming the insulating layers, a thermoplastic polyimide sheet (Brand name: Espanex manufactured by Nippon Steel Chemical Co., Ltd.) was laminated by vacuum pressing (at 200° C. for 30 minutes) on each of the upper and the lower innermost wring patterns. The thickness of each insulating layer was 0.05 mm. Then, the insulating layer was formed with a prescribed number of via holes with the use of UV-YAG laser. Then, a second innermost wiring pattern of copper was formed on each of the upper and the lower insulating layers by the semi-additive process. At this stage, the copper material was deposited on the wall surface of each via hole, so that the resultant via was connected to the copper wiring pattern. The specific procedure here was the same as the semi-additive process described above regarding the innermost wiring patterns and through-hole vias. Thereafter, the same series of procedures for formation of a build-up insulating layer, a wiring pattern and vias were performed three times on each of the upper and the lower sides of the core layer. In this manner, a build-up portion with a five-storied wiring structure was formed on each of the upper and the lower sides of the core layer.

Finally, the screen-printing and photolithography were performed to produce an overcoat layer on each of the upper and lower build-up portions. The overcoat layer was formed with several openings for exposing the prescribed parts of the outermost wiring pattern as electrode pads.

<Temperature Cycle Test>

The connection reliability between the multilayer wiring board (obtained in the above manner) and a semiconductor chip mounted on the board was checked by a temperature cycle test. The semiconductor chip used for the continuity test was provided with a plurality of bump electrodes for external connection.

Specifically, first, measurements were made of the initial resistance at the electrical connecting portions between the semiconductor chip and the multilayer wiring board. Then, the wiring board with the semiconductor chip mounted thereon was subjected to cyclic temperature change, in which the board with the chip was exposed to a low temperature (−65° C.) for 30 minutes and to a high temperature (125° C.) for 30 minutes. This cooling and heating cycle was repeated 1000 times. Thereafter, measurements were made again of the resistance at the electrical connecting portions between the semiconductor chip and the multilayer wiring board. The result was that the resistance between the chip and the wiring board was increased or decreased only by no greater than 10%. This shows that the electrical connection between the chip and the wiring board was stable. It was also found that no cracking nor peeling occurred at the electrical connecting portions between the chip and the wiring board.

The same temperature cycle test was performed with respect to the multilayer wiring board, with no semiconductor chip mounted thereon, for checking the change in resistance between a selected pair of electrode pads. By this test, it is possible to indirectly check the continuity of each through-hole via. The result was that the resistance change between electrode pads was no greater than 5%. This shows that the initial wiring structure of the wiring board was maintained after exposed to the high and low temperatures. Further, subsequent to the temperature cycle test, an inspection was performed to check if the through-hole vias were broken. The result was that no breakage was observed at the respective through-hole vias.

EXAMPLE 2

<Making the Multilayer Wiring Board>

In this example, the CFRP plate was formed from carbon fiber cloth and an epoxy resin composite. The CFRP plate was produced in the following manner. First, carbon fiber cloth (Brand name: TORAYCA manufactured by Toray Industries Inc.) was impregnated with a thermosetting epoxy resin composite and then dried to provide a prepreg having a thickness of 0.2 mm. The carbon fiber cloth was the same kind as used for Example 1 discussed above. The epoxy resin composite, before hardened, contained monomers (for forming the polymer), a hardener, and inorganic fillers such as aluminum nitride powder (no greater than 8 $\mu$m in weight average particle size) and silica powder (no greater than 3 $\mu$m in weight average particle size). The epoxy resin composite contained a 5 wt % of aluminum nitride powder and a 25 wt % of silica powder. The thermal expansion coefficient of the aluminum nitride powder was 5 ppm/° C. (at 25° C.), while the thermal expansion coefficient of the silica powder was 3 ppm/° C. (at 25° C.).

To form the CFRP plate, five prepregs were prepared in the above-described manner. Then, these prepregs were stacked and pressed together (i.e. squeezed in the stacking direction) in a vacuum at 200° C. for one hour. As a result, a CFRP plate (1.0 mm in thickness) was obtained. The average thermal expansion coefficients of the CFRP plate (at 25~150° C.) were 3 ppm/° C. in the surface-spreading direction and 70 ppm/° C. in the thickness direction.

The CFRP plate was formed with a prescribed number of through-holes (each having a diameter of 0.5 mm) by drilling. Then, the upper and the lower surfaces of the CFRP plate were laminated by an insulating layer formed from an epoxy sheet (Brand name: SH-9 manufactured by Ajinomoto Co., Inc.). The lamination of the epoxy sheet was performed by vacuum pressing at 170° C. for 30 minutes, so that the resultant insulating layer had a thickness of 0.05 mm. The through-holes formed in the CFRP plate were filled up by the epoxy resin.

Then, at each through-hole filled up by the epoxy resin, a diametrically smaller through-hole was formed with the use of UV-YAG laser. The smaller through-hole had a diameter of 0.2 mm and was coaxial with the larger through-hole formed in the CFRP plate. Then, the semi-additive process was performed in the same manner as for Example 1 discussed above, to make a copper wiring pattern on each of the upper and lower insulating layers and also to make a through-hole via at each of the smaller through-holes formed in the epoxy resin.

Then, another build-up insulating layer was formed over each of the innermost wiring patterns. Specifically, for forming the insulating layers, an epoxy sheet (Brand name: SH-9 manufactured by Ajinomoto Co., Inc.) was laminated by vacuum pressing (at 170° C. for 30 minutes) on each of the upper and the lower innermost wring patterns. The thickness of each insulating layer was 0.05 mm. Then, the insulating layer was formed with a prescribed number of via holes with the use of UV-YAG laser. Then, a second innermost wiring pattern of copper was formed on each of the upper and the lower insulating layers by the semi-additive process. At this stage, the copper material was deposited on the wall surface of each via hole, so that the resultant via was connected to the copper wiring pattern. The specific procedure here was the same as the semi-additive process described above regarding the innermost wiring patterns and through-hole vias of Example 1. Thereafter, the same series of procedures for formation of a build-up insulating layer, a wiring pattern and vias were performed three times on each of the upper and the lower sides of the core layer. In this manner, a build-up portion with a five-storied wiring structure was formed on each of the upper and the lower sides of the core layer.

Finally, the screen-printing and photolithography were performed to produce an overcoat layer on each of the upper and lower build-up portions. The overcoat layer was formed with several openings for exposing the prescribed parts of the outermost wiring pattern as electrode pads.

<Temperature Cycle Test>

As in the case of Example 1, the connection reliability between the multilayer wiring board and a semiconductor chip mounted on the board was checked by a temperature cycle test. Again, the semiconductor chip used for the continuity test was provided with a plurality of bump electrodes for external connection. The result of the test was that the resistance between the chip and the wiring board was increased or decreased only by no greater than 10%. This shows that the electrical connection between the chip and the wiring board was stable. It was also found that no cracking nor peeling occurred at the electrical connecting portions between the chip and the wiring board.

Further, the same temperature cycle test was performed with respect to the multilayer wiring board, with no semiconductor chip mounted thereon, for checking the change in resistance between a selected pair of electrode pads. The result was that the resistance change between electrode pads was no greater than 5%. This shows that the initial wiring structure of the wiring board was maintained after exposed to the high and low temperatures. Further, subsequent to the temperature cycle test, an inspection was performed to check if the through-hole vias were broken. The result was that no breakage was observed at the respective through-hole vias.

Comparative Sample 1

A multilayer wiring board was produced in the same manner as in Example 1, except that the CFRP plate was replaced by an organic core plate of the same size. The organic core plate was composed of glass cloth as the base material and a BT resin enclosing the glass cloth. As in the case of Example 1, a temperature cycle test (with the cooling-heating cycle repeated 1000 times) was performed for checking the reliability of the electrical connection between the multilayer wiring board of Sample 1 and a semiconductor chip mounted on the board. The result was that some cracking occurred at the boundary between the bump electrodes of the semiconductor chip and the electrode pads of the wiring board.

Comparative Sample 2

A multilayer wiring board was produced in the same manner as in the case of Example 2, except that the epoxy resin of the CFRP plate did not contain inorganic filler. In a temperature range of 25~150° C., the average thermal expansion coefficients of the CFRP plate were 2 ppm/° C. in the surface-spreading direction and 150 ppm/° C. in the thickness direction. The multilayer wiring board of Comparative Sample 2 was subjected to the same temperature cycle test as in the case of Example 1. The subsequent resistivity checking for the selected electrodes revealed that the continuity of some of the through-hole vias was broken.

Evaluation

The multilayer wiring boards of Examples 1 and 2, as noted above, contained a core layer whose thermal expansion coefficient in the surface-spreading direction was made appropriately small in the presence of carbon fiber cloth. The temperature cycle tests showed that such a multilayer wiring board is more advantageous than the conventional multilayer wiring board with an inorganic core (Comparative Sample 1) in that the electrical connection between the wiring board and a semiconductor chip mounted thereon is stable. The superior connection stability results from the reduced thermal expansion of the wiring board due to the carbon fiber cloth contained in the core layer.

Further, the temperature cycle tests showed that the wiring boards of Examples 1 and 2 are more advantageous than the wiring board of Comparative Sample 2 in that the breakage of the through-hole vias is reliably prevented. This is because the resin material of the core layer by Examples 1 and 2 contains inorganic filler whereby the thermal expansion of the core layer is reduced in the thickness direction, while the resin material of the core layer by Comparative Sample 2 contains no such filler.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A wiring board comprising:
   a core layer made of a carbon fiber material and a resin composite containing inorganic filler, the core layer including a first surface and a second surface opposite to the first surface;
   a first wiring portion provided with an insulating layer formed on the first surface of the core layer and with a wiring pattern formed on the insulating layer;
   a through-hole via penetrating the core layer in a direction normal to the first and second surfaces, the through-hole via being electrically connected to the wiring pattern; and
   an insulating resin portion between the core aver and the through-hole via and containing resin but not the carbon fiber material for insulating the through-hole via from the carbon fiber material contained in the core layer.

2. The wiring board according to claim 1, further comprising a second wiring portion provided with an insulating layer formed on the second surface of the core layer and with a wiring pattern formed on the insulating layer, wherein the through-hole via is electrically connected to both the wiring pattern of the first wiring portion and the wiring pattern of the second wiring portion.

3. The wiring board according to claim 1, wherein the first wiring portion comprises a plurality of insulating layers and a plurality of wiring patterns stacked alternatively with the insulating layers, and wherein at least one of the insulating layers is formed with a via for electrically connecting adjacent wiring patterns.

4. The wiring board according to claim 1, wherein the core layer has a first thermal expansion coefficient in said normal direction, the first thermal expansion coefficient being in a range of 20~120 ppm/°C. at 25° C.

5. The wiring board according to claim 1, wherein the core layer has a second thermal expansion coefficient in a surface-spreading direction transverse to said normal direction, the second thermal expansion coefficient being in a range of 0~17 ppm/° C. at 25° C.

6. The wiring board according to claim 1, wherein the carbon fiber material is in a form of mesh, cloth or non-woven fabric.

7. The wiring board according to claim 1, wherein the core layer contains 30~80 vol % of carbon fiber material.

8. The wiring board according to claim 1, wherein the inorganic filler has a thermal expansion coefficient in a range of 1~20 ppm/° C. at 25° C.

9. The wiring board according to claim 1, wherein the inorganic filler is made of one of silica, alumina, magnesium hydroxide, aluminum nitride and aluminum hydroxide.

10. The wiring board according to claim 1, wherein the resin composite contains 5~50 wt % of inorganic filler.

11. The wiring board according to claim 1, wherein the inorganic filler comprises inorganic particles having an average particle size not greater than 10 μm.

12. The wiring board according to claim 1, wherein the resin composite comprises one of polysulfone, polyethersulfone, polyphenylsulfone, polyphthalamide, polyamide imide, polyketone, polyacetal, polyimide, polycarbonate, denatured polyphenylene ether, polyphenylene oxide, polybutyrene terephthalate, polyacrylate, polyphenylene sulfide, polyether ether ketone, tetrafluoroethylene, epoxy, cyanate ester, and bismaleimide.

* * * * *

UNITED STATES PATENT AND TRADEMARK OFFICE
CERTIFICATE OF CORRECTION

PATENT NO.     : 6,869,665 B2
DATED          : March 22, 2005
INVENTOR(S)    : Motoaki Tani et al.

It is certified that error appears in the above-identified patent and that said Letters Patent is hereby corrected as shown below:

Column 12,
Line 63, change "aver" to -- layer --.

Column 13,
Lines 17 and 22, delete "." after first "°C".

Column 14,
Line 5, delete "." after the first "°C";
Line 10, after "% of" insert -- the --.

Signed and Sealed this

Eleventh Day of October, 2005

JON W. DUDAS
*Director of the United States Patent and Trademark Office*